United States Patent

Sada et al.

(10) Patent No.: US 6,174,375 B1
(45) Date of Patent: Jan. 16, 2001

(54) SEMICONDUCTOR DEVICE MANUFACTURING SYSTEM CAPABLE OF AUTOMATIC BRANCHING AND MERGING OF WAFERS

(75) Inventors: Toshihiro Sada; Hideo Toyota, both of Tokyo (JP)

(73) Assignee: NEC Corporation, Tokyo (JP)

(*) Notice: Under 35 U.S.C. 154(b), the term of this patent shall be extended for 0 days.

(21) Appl. No.: 08/865,673

(22) Filed: May 30, 1997

(51) Int. Cl.$^7$ .................................................. C23C 16/00
(52) U.S. Cl. ................. 118/715; 438/4; 438/29; 438/25.01; 414/935; 364/468.28; 364/468.06; 156/345
(58) Field of Search ............... 118/715; 364/468.28, 364/468.06; 156/345; 438/14, 29, 25.01; 414/935

(56) References Cited

U.S. PATENT DOCUMENTS 5,164,905 * 11/1992 Iwasaki et al. ................. 364/468
5,389,769 * 2/1995 Yamashita et al. ............... 235/375
5,930,137 * 7/1999 Togashi ........................ 364/468.06
5,930,138 * 7/1999 Lin et al. ...................... 364/468.15

FOREIGN PATENT DOCUMENTS 6-176994    6/1994   (JP).

* cited by examiner

Primary Examiner—Shrive Beck
Assistant Examiner—Norca L. Torres
(74) Attorney, Agent, or Firm—Foley & Lardner

(57) ABSTRACT

In a semiconductor device manufacturing system including a plurality of semiconductor device manufacturing equipment, a control circuit is connected to the semiconductor device manufacturing equipment. Also, a lot status memory for storing status of lots of semiconductor wafers, a branch content memory for storing branch information of the lots of semiconductor wafers, and a determination level memory for storing determination levels of the lots of semiconductor wafers are connected to the control circuit.

8 Claims, 6 Drawing Sheets

Fig. 3A

| PRODUCT NAME | × × × |
|---|---|

Fig. 3B

| PROCESS NAME | × × |
|---|---|

Fig. 3C

| BRANCH CONTENT | × × × × |
|---|---|

Fig. 3D

| NUMBER OF LEVELS | × × |
|---|---|

Fig. 3E

| LEVELS | NUMBER OF WAFERS |
|---|---|
| 0 1 | × × |
| 0 2 | × × |

*Fig. 3F*

| PROCESS CODE | PROCESS NAME | LEVELS | LEVEL NO. | WAFERS | COMMENTS |
|---|---|---|---|---|---|
| | | | | | |

*Fig. 3G*

| LOT NO. | xxxxxxxxx |
|---|---|

# SEMICONDUCTOR DEVICE MANUFACTURING SYSTEM CAPABLE OF AUTOMATIC BRANCHING AND MERGING OF WAFERS

BACKGROUND OF THE INVENTION

1. Field of the Invention

The present invention relates to a semiconductor device manufacturing system.

2. Description of the Related Art

In a method for manufacturing semiconductor devices (wafers), when a new process condition is introduced or a new equipment is introduced, some wafers of a lot are subjected to new process conditions or new equipment, while other wafers of this lot are subjected to the old processes or old equipment. For example, when new ion implantation equipment is introduced, the new ion implantation equipment is used on 10 wafers of a lot, while the old ion implantation equipment is used on 40 wafers of this lot. Thus, branching and merging of wafers are required.

In a prior art method for branching and merging wafers of a lot, the operator searches wafer numbers and branches some of the wafers manually by using vacuum tweezers. Then, the operator sets a new process in the semiconductor device manufacturing equipment in accordance with a manuscript or the like to perform the new process upon the branched wafers. Then, the operator merges the branched wafers with the other wafers by using the vacuum tweezers.

In the above-mentioned prior art wafer branching and merging method, however, since the operation therefor is manually carried out, a long operating time is required. Also, since the operation is carried out by using the vacuum tweezers, the wafers may be damaged which reduces the manufacturing yield. Further, since the operation is carried out by using a manuscript or the like, the operation may become inaccurate and be carried out incorrectly.

SUMMARY OF THE INVENTION

It is an object of the present invention to provide a semiconductor device manufacturing system capable of automatic branching and merging of wafers.

According to the present invention, in a semiconductor device manufacturing system including a plurality of semiconductor device manufacturing equipment, a control circuit is connected to the semiconductor device manufacturing equipment. Also, a lot status memory for storing the status of lots of semiconductor wafers, a branch content memory for storing branch information of the lots of semiconductor wafers, and a determination level memory for storing determination levels of the lots of semiconductor wafer are connected to the control circuit.

Thus, the branching and merging of wafers can be carried out in accordance with the contents of the lot status memory, the branch content memory and the determination level memory.

BRIEF DESCRIPTION OF THE DRAWINGS

The present invention will be more clearly understood from the description as set forth below, wherein:

FIGS. 3A through 3G are diagrams showing the contents of the display unit of the data inputting terminal of FIG. 1;

DESCRIPTION OF THE PREFERRED EMBODIMENT

Figure 1:
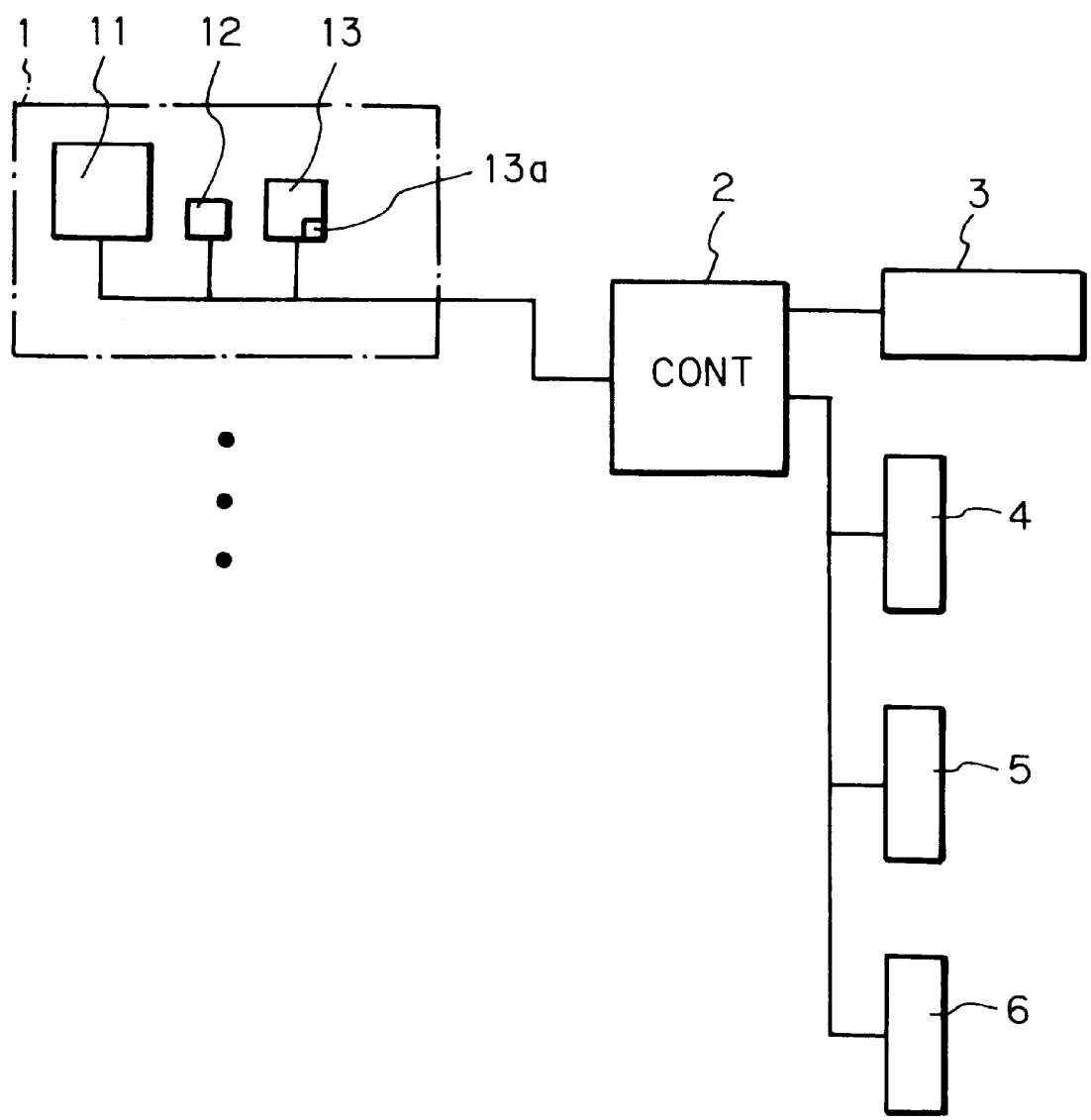
FIG. 1 is a block circuit diagram illustrating an embodiment of the semiconductor device manufacturing system according to the present invention.
Figure 2:
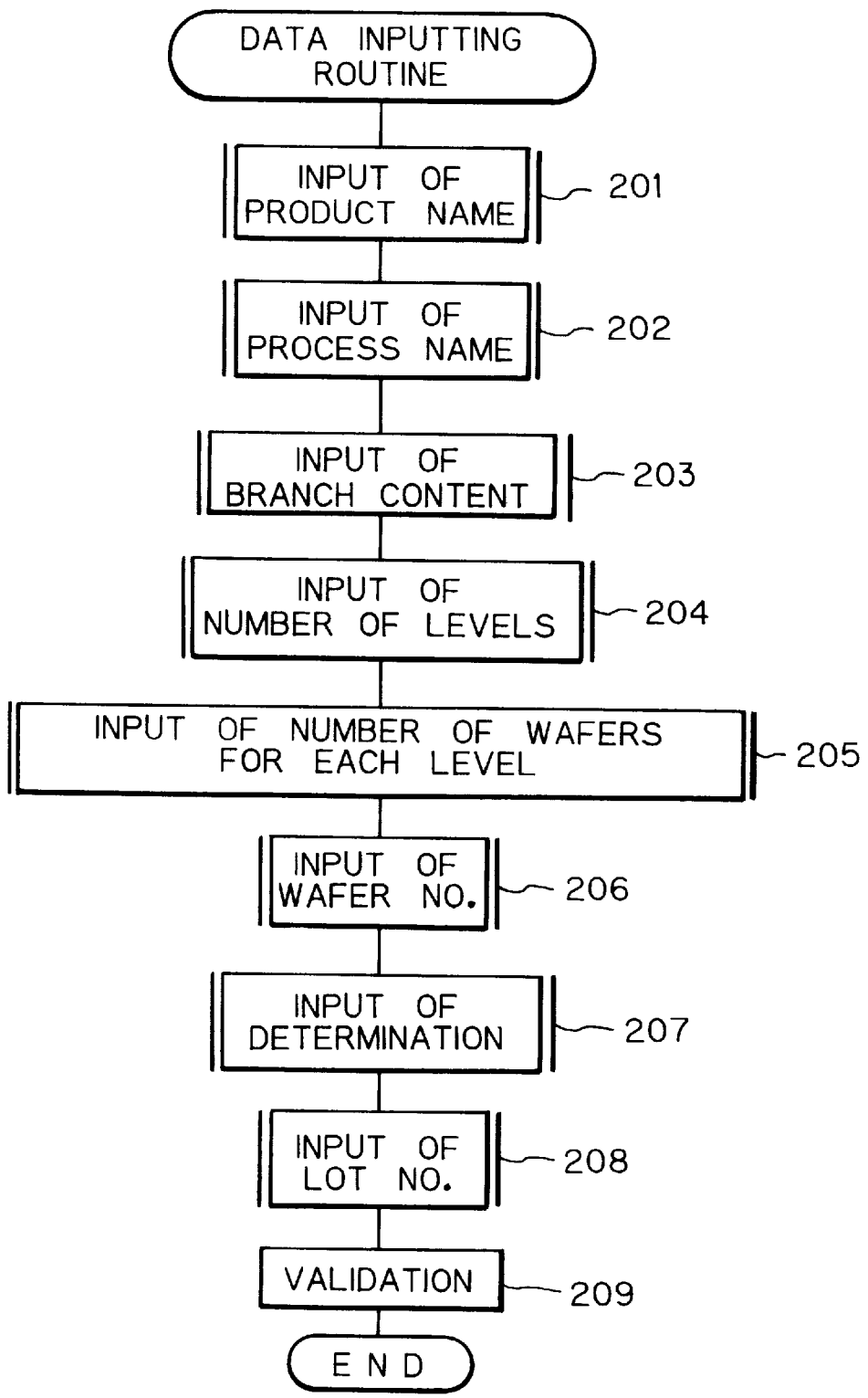
FIG. 2 is a flowchart of the operation of the data inputting terminal of FIG. 1.

In FIG. 1, which illustrates an embodiment of the semiconductor device manufacturing system according to the present invention, reference numeral 1 designates a semiconductor device manufacturing equipment including a semiconductor device processing unit 11 such as an ion implanting apparatus or a photolithography and etching apparatus, a tester 12 such as a characteristic checker or a dimension measurement apparatus, and a wafer sorter 13 including a charge-coupled device (CCD) camera 13a for monitoring identification numbers marked on wafers. Note that identification numbers such as a product name, a lot number and a wafer number are usually marked on each wafer.

The semiconductor device manufacturing equipment 1 and other manufacturing equipment (not shown) are connected to a control circuit 2, i.e., a host computer by a local area network (LAN). Also, a data inputting terminal 3 including a display unit is connected to the control circuit 2 by the LAN.

Further, a lot status memory 4 for storing the status of lots, a process branch content memory 5 for storing process branch contents, and a determination level memory 6 for storing determination levels for the branched processes are connected to the control circuit 2.

The data inputting operation of the control circuit 2 of FIG. 1 is explained next with reference to FIGS. 2, 3A, 3B, 3C, 3D, 3E, 3F and 3G.

First, at step 201, "PRODUCT NAME" as shown in FIG. 3A is displayed on the display unit of the data inputting terminal 3. Then, the operator inputs three digits for a product name or the like by using the keyboard of the data inputting terminal 3.

Next, at step 202, "PROCESS NAME" as shown in FIG. 3B is displayed on the display unit of the data inputting terminal 3. Then, the operator inputs a code of two digits showing a process such as an ion implanting step, a photoresist pattern forming step or the like by using the keyboard of the data inputting terminal 3.

Next, at step 203, "BRANCH CONTENT" as shown in FIG. 3C is displayed on the display unit of the data inputting terminal 3. Then, the operator inputs four digits for a branch content such as an ion implantation energy, an ion implantation number or the like by using the keyboard of the data inputting terminal 3.

Next, at step 204, "NUMBER OF LEVELS" as shown in FIG. 3D is displayed on the display unit of the data inputting terminal 3. Then, the operator inputs two digits for the number of levels such as 02 by using the keyboard of the data inputting terminal 3.

Next, at step 205, if the number of levels inputted as step 204 is 02, "LEVEL 01" and "LEVEL 02" as shown in FIG. 3E is displayed on the display unit of the data inputting terminal 3. Then, the operator inputs two digits for each of the levels 01 and 02, respectively, by using the keyboard of the data inputting terminal 3.

Next, at step 206, a table as shown in FIG. 3F is displayed on the display unit of the data inputting terminal 3. In this case, the process code, the process name and the number of levels are already determined. Then, the operator designates a level number such as 01, 02, . . . , and inputs wafer numbers into a column of "WAFERS" by using the keyboard of the data inputting terminal 3. For example, wafer numbers 01, 02, . . . , 40 are input for the level 01, and wafer numbers 41, 42, . . . , 50 are inputted for the level 02.

Next, at step 207, the operator inputs a determination level for each level by using the keyboard of the data inputting terminal 3, as occasion demands. In this case, the content of the input determination level is displayed in a column of "COMMENTS" as shown in FIG. 3F. Thus, the content of the input determination level can be recognized by the operator.

Next, at step 208, "LOT NO." as shown in FIG. 3G is displayed on the display unit of the data inputting terminal 3. Then, the operator inputs nine digits as a lot number by using the keyboard of the data inputting terminal 3.

Finally, at step 209, a validation is carried out to determine the content of branch content.

Thus, the product names, the process names and the lot numbers are stored in the lot status memory 4. Also, the branch contents, the number of levels, the number of wafers and the wafer numbers are stored in the branch content memory 5. Further, the determination level is stored in the determination level memory 6.

Figure 4:
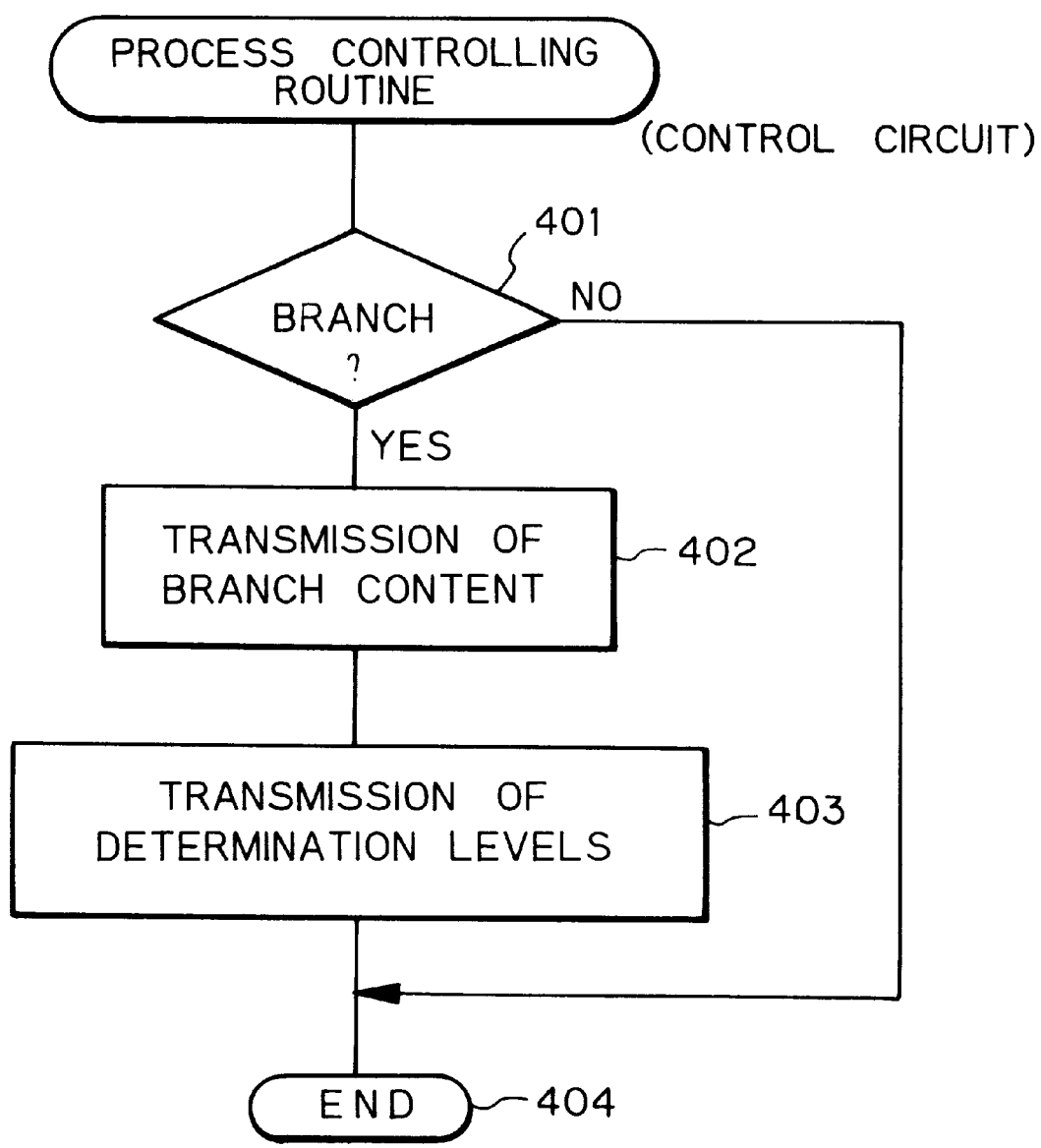
FIG. 4 is a flowchart of the operation of the control circuit of FIG. 1.

The process controlling operation of the control circuit 2 is explained next with reference to FIG. 4.

First, at step 401, when one semiconductor device manufacturing equipment transmits lot information for the next lot, the control circuit 2 determines whether or not the wafers of this lot should be branched. In this case, it is determined whether or not the product name, the process name and the lot number of the next lot are the same as those in the lot status memory 4.

Only if it is determined that the wafers of this lot should be branched, does the control proceed to step 402 which transmits the branch content, the number of levels, the number of wafers and the wafer numbers from the branch content memory 5 via the LAN to the above-mentioned semiconductor device manufacturing equipment. Then, at step 403, the control circuit 2 transmits the determination levels from the determination level memory 6 via the LAN to the above-mentioned semiconductor manufacturing equipment. Then, the control proceeds to step 404.

On the other hand, at step 401, if it is determined that the wafers of this lot should not be branched, the control directly proceeds to step 404.

The process executing operation of one semiconductor device manufacturing equipment is explained next with reference to FIG. 5.

First, at step 501, it is determined whether or not the wafers of the next lot should be branched in accordance with the information transmitted by the control circuit 2. As a result, if it is determined that the wafers should be branched, the control proceeds to steps 502, 503 and 505. Otherwise, the control proceeds to steps 506 and 507.

At step 502, the wafers are divided into a plurality of groups by the CCD camera 13a with reference to the wafer numbers. Next, at step 503, different processes are performed upon the groups of wafers. For example, different ion implantation energies are used for the groups of wafers. Next, at step 504, different determinations are performed upon the groups of wafers. For example, different threshold voltage determinations are used for the groups of wafers. In this case, the results of the determinations are displayed as occasion demands. Next, at step 505, the wafers are merged into one group.

On the other hand, at step 506, the same process is performed upon all the wafers. For example, the same ion implantation energy is used for all the wafers. Next, at step 507, the same determination is performed upon all the wafers. For example, the same threshold voltage determination is used for all the wafers. In this case, the results of the determinations are displayed as occasion demands.

Figure 5:
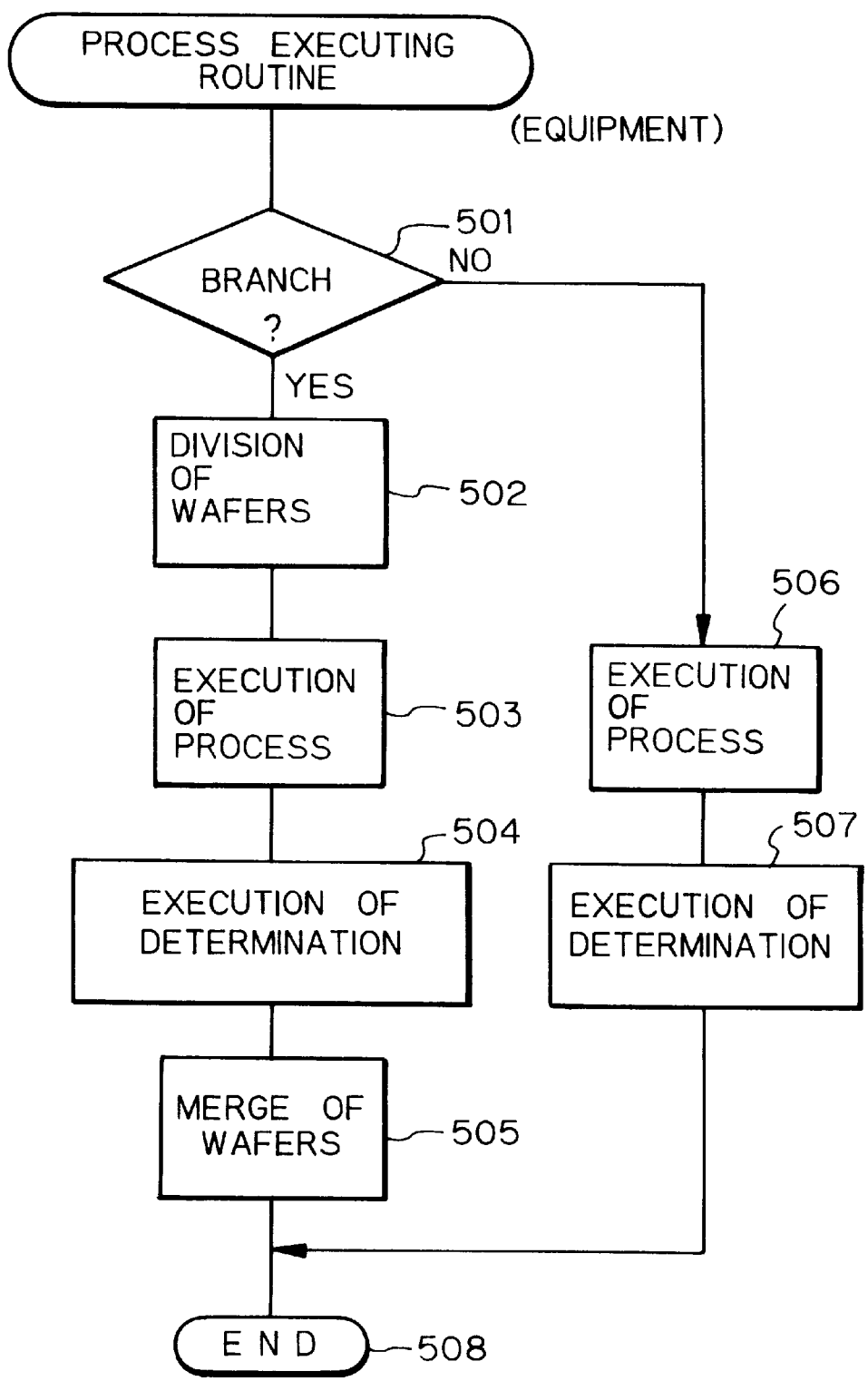
FIG. 5 is a flowchart of the operation of the semiconductor device manufacturing equipment of FIG. 1.

Then, the routine of FIG. 5 is completed by step 508.

Note that the process conditions at step 506 and the determination condition at step 507 are usually stored in the control circuit of each semiconductor device manufacturing equipment.

Also, at step 502, the wafers divided into a plurality of groups are actually put into a plurality of wafer boxes; however, it is not always necessary to physically divide the wafers. In this case, steps 503 and 505 are unnecessary.

In the above-mentioned embodiment, the wafers of each lot are branched within one semiconductor device manufacturing equipment, however, the wafers of each lot can be branched into a plurality of semiconductor device manufacturing equipment, such as an old equipment and new equipment.

As explained hereinabove, the branching and merging of wafers can be automatically carried out. As a result, the operating time can be reduced, and the manufacturing yield can be enhanced. Further, the operation can be carried out accurately.

What is claimed is:

1. A semiconductor device manufacturing system comprising:

a plurality of semiconductor device manufacturing equipment;

a control circuit connected to said plurality of semiconductor device manufacturing equipment;

a lot status memory, connected to said control circuit, for storing status of lots of semiconductor wafers;

a branch content memory, connected to said control circuit, for storing branch information of said lots of semiconductor wafers;

a determination level memory, connected to said control circuit, for storing determination levels of said lots of semiconductor wafers and wherein each of said semiconductor device manufacturing equipment comprises:

means for determining whether or not the wafers of said lot should be branched;

means for dividing the wafers of said lot into a plurality of groups after it is determined that the wafers of said lot should be branched;

means for performing different processes upon said groups after the wafers of said lot divided into said groups;

means for selecting different determination levels and for performing different determination operations using said different determination levels upon said groups after said different processes are performed; and means for merging said groups after said different determination levels are performed;

wherein said control circuit comprises;

means for transmitting different determination levels to different ones of said semiconductor device manufacturing equipment corresponding to each of said groups.

2. The system as set forth in claim 1, wherein said control circuit comprises:

means for determining whether or not wafers of a lot of one of said semiconductor device manufacturing equipment should be branched in accordance with said status of lots of semiconductor wafers in said lot status memory;

means for transmitting said branch information regarding said one of said semiconductor device manufacturing equipment stored in said branch content memory after it is determined that the wafers of said lot should be branched; and means for transmitting said determination levels regarding said one of said semiconductor device manufacturing equipment stored in said branch content memory after it is determined that the wafers of said lot should be branched.

3. The system as set forth in claim 1, wherein said status of lots includes a product name, a process name and a lot number, said branch information including a branch content, a number of levels, a number of wafers and wafer numbers.

4. The system as set forth in claim 1, further comprising a data inputting terminal connected to said control circuit, for inputting data in said lot status memory, said branch content memory and said determination level memory.

5. A semiconductor device manufacturing system comprising:

a plurality of semiconductor device manufacturing equipment;

a control circuit connected to said plurality of semiconductor device manufacturing equipment;

a lot status memory. connected to said control circuit, for storing status of lots of semiconductor wafers;

a branch content memory, connected to said control circuit, for storing branch information of said lots of semiconductor wafers;

a determination level memory, connected to said control circuit, for storing determination levels of said lots of semiconductor wafers, and wherein each of said semiconductor device manufacturing equipment comprises:

means for determining whether or not the wafers of said lot should be branched;

means for dividing the wafers of said lot into a plurality of groups after it is determined that the wafers of said lot should be branched;

means for performing different processes upon said groups after the wafers of said lot are divided into said groups;

means for selecting different determination levels and for performing different determination operations using said different determination levels upon said groups after said different processes are performed; and means for merging said groups after said different determination levels are performed;

wherein said control circuit comprises:

means for transmitting different determination levels to different ones of said semiconductor device manufacturing equipment corresponding to each of said groups;

wherein each of said semiconductor device manufacturing equipment comprises a charge-coupled device camera for recognizing numbers of said wafers.

6. The system as set forth in claim 5, wherein said control circuit comprises:

means for determining whether or not wafers of a lot of one of said semiconductor device manufacturing equipment should be branched in accordance with said status of lots of semiconductor wafers in said lot status memory;

means for transmitting said branch information regarding said one of said semiconductor device manufacturing equipment stored in said branch content memory after it is determined that the wafers of said lot should be branched; and means for transmitting said determination levels regarding said one of said semiconductor device manufacturing equipment stored in said branch content memory after it is determined that the wafers of said lot should be branched.

7. The system as set forth in claim 5, wherein said status of lots includes a product name, a process name and a lot number, said branch information including a branch content, a number of levels, a number of wafers and wafer numbers.

8. The system as set forth in claim 5, further comprising a data inputting terminal connected to said control circuit, for inputting data in said lot status memory, said branch content memory and said determination level memory.

* * * * *